(12) United States Patent
Liu et al.

(10) Patent No.: US 12,439,753 B2
(45) Date of Patent: Oct. 7, 2025

(54) FLIP-CHIP LIGHT EMITTING DIODE HAVING CONNECTING ELECTRODES WITH MULTIPLE BINDING LAYERS INCLUDING EUTECTIC SYSTEM WITH TIN

(71) Applicant: XIAMEN SANAN OPTOELECTRONICS CO., LTD., Xiamen (CN)

(72) Inventors: Shiwei Liu, Xiamen (CN); Gaolin Zheng, Xiamen (CN); Anhe He, Xiamen (CN); Qing Wang, Xiamen (CN); Su-Hui Lin, Xiamen (CN); Kang-wei Peng, Xiamen (CN); Ling-yuan Hong, Xiamen (CN); Jiangbin Zeng, Xiamen (CN)

(73) Assignee: XIAMEN SANAN OPTOELECTRONICS CO., LTD., Xiamen (CN)

( * ) Notice: Subject to any disclaimer, the term of this patent is extended or adjusted under 35 U.S.C. 154(b) by 633 days.

(21) Appl. No.: 17/664,950

(22) Filed: May 25, 2022

(65) Prior Publication Data

US 2022/0285596 A1 Sep. 8, 2022

Related U.S. Application Data

(63) Continuation-in-part of application No. PCT/CN2020/087213, filed on Apr. 27, 2020.

(30) Foreign Application Priority Data

Dec. 10, 2019 (CN) .......................... 201922201185.3

(51) Int. Cl.
*H10H 20/857* (2025.01)
*H01L 23/00* (2006.01)
(Continued)

(52) U.S. Cl.
CPC ........... *H10H 20/857* (2025.01); *H01L 24/05* (2013.01); *H01L 24/13* (2013.01); *H01L 24/16* (2013.01);
(Continued)

(58) Field of Classification Search
CPC ......... H01L 33/62; H01L 24/05; H01L 24/13; H01L 24/16; H01L 33/08; H01L 24/81;
(Continued)

(56) References Cited

U.S. PATENT DOCUMENTS

2013/0277696 A1* 10/2013 Matsui .................... H01L 33/62
257/96
2016/0260869 A1* 9/2016 Jeon ........................ H01L 33/38
(Continued)

FOREIGN PATENT DOCUMENTS

CN 104779339 A 7/2015
CN 110459653 A * 11/2019 ......... H01L 33/0075

OTHER PUBLICATIONS

Search Report appended to an Office Action, which was issued to Chinese counterpart application No. 202080005596.8 by the CNIPA on May 19, 2023 with an English translation thereof.
(Continued)

*Primary Examiner* — Herve-Louis Y Assouman
(74) *Attorney, Agent, or Firm* — Thomas Horstemeyer, LLP

(57) ABSTRACT

A light-emitting device includes a carrier substrate, a flip-chip light-emitting diode (LED) mounted onto the carrier substrate, and an electrode unit disposed between the carrier substrate and the flip-chip LED. The electrode unit includes first and second connecting electrodes that have opposite conductivity. Each of the first and second connecting electrodes includes an intermediate metal layer and a binding layer that are sequentially disposed on the flip-chip LED in
(Continued)

such order. The binding layer includes a first portion being adjacent to the carrier substrate and forming an eutectic system with tin, and a second portion located between the first portion and the intermediate metal layer.

17 Claims, 7 Drawing Sheets

(51) Int. Cl.
  *H10H 20/813* (2025.01)
  *H10H 20/831* (2025.01)
  *H10H 20/832* (2025.01)
  *H10H 20/841* (2025.01)
  *H10H 20/85* (2025.01)

(52) U.S. Cl.
  CPC ........... *H10H 20/813* (2025.01); *H01L 24/81* (2013.01); *H01L 2224/05026* (2013.01); *H01L 2224/05083* (2013.01); *H01L 2224/05084* (2013.01); *H01L 2224/05124* (2013.01); *H01L 2224/05144* (2013.01); *H01L 2224/05147* (2013.01); *H01L 2224/05155* (2013.01); *H01L 2224/05166* (2013.01); *H01L 2224/05171* (2013.01); *H01L 2224/05561* (2013.01); *H01L 2224/05572* (2013.01); *H01L 2224/05611* (2013.01); *H01L 2224/05655* (2013.01); *H01L 2224/13006* (2013.01); *H01L 2224/13111* (2013.01); *H01L 2224/13113* (2013.01); *H01L 2224/13118* (2013.01); *H01L 2224/13139* (2013.01); *H01L 2224/13144* (2013.01); *H01L 2224/13147* (2013.01); *H01L 2224/16225* (2013.01); *H01L 2224/16502* (2013.01); *H01L 2224/81805* (2013.01); *H01L 2224/81815* (2013.01); *H01L 2924/0132* (2013.01); *H01L 2924/0133* (2013.01)

(58) Field of Classification Search
  CPC . H01L 2224/05026; H01L 2224/05083; H01L 2224/05084; H01L 2224/05124; H01L 2224/05144; H01L 2224/05147; H01L 2224/05155; H01L 2224/05166; H01L 2224/05171; H01L 2224/05561; H01L 2224/05572; H01L 2224/05611; H01L 2224/05655; H01L 2224/13006; H01L 2224/13111; H01L 2224/13113; H01L 2224/13118; H01L 2224/13139; H01L 2224/13144; H01L 2224/13147; H01L 2224/16225; H01L 2224/16502; H01L 2224/81805; H01L 2224/81815; H01L 2924/0132; H01L 2924/0133; H01L 33/382; H01L 33/387; H01L 33/46; H01L 2224/16013; H01L 2224/16238; H01L 33/40; H01L 33/486
  See application file for complete search history.

(56) References Cited

U.S. PATENT DOCUMENTS

2016/0313848 A1* 10/2016 Rhee .................... H01L 25/0753
2020/0313049 A1* 10/2020 Huang .................... H01L 33/60

OTHER PUBLICATIONS

Search Report issued to PCT application No. PCT/CN2020/087213 on Sep. 16, 2020.

* cited by examiner

FLIP-CHIP LIGHT EMITTING DIODE HAVING CONNECTING ELECTRODES WITH MULTIPLE BINDING LAYERS INCLUDING EUTECTIC SYSTEM WITH TIN

CROSS-REFERENCE TO RELATED APPLICATION

This application is a bypass continuation-in-part (CIP) application of PCT International Application No. PCT/CN2020/087213, filed on Apr. 27, 2020, which claims priority of Chinese Utility Model Patent Application No. 201922201185.3, filed on Dec. 10, 2019. The entire content of each of the International and Chinese patent applications is incorporated herein by reference.

FIELD

The disclosure relates to a light-emitting device including a flip-chip light-emitting diode.

BACKGROUND

A conventional light-emitting diode (LED) made of semiconductor materials emits light energy when a current is applied to the semiconductor materials to allow recombination of electrons and holes. Compared with conventional light sources, the LED is advantageous in terms of lower power consumption, environmentally friendly, long service life and possessing fast response time. Therefore, the LED has been widely used in lightings and displays.

An LED package or LED device is manufactured by mounting LED chip(s) onto a substrate, which is commonly conducted through wire bonding and flip-chip packaging techniques. It is known that flip-chip packaging techniques are advantageous for reducing size of LED package and shortening signal transmission path, thus being widely used in packaging of high power LED chips. One of the flip-chip packaging techniques involves applying a solder paste between connecting electrodes of the LED chips and the substrate (such as a packaging substrate or circuit board), followed by subjecting the LED chips and the substrate to heating in a reflow oven, so as to achieve eutectic bonding.

In development of displays and flexible lighting apparatus, the packaging substrate used may be flexible. Yet, such flexible substrate has a relatively high coefficient of thermal expansion. When conventional connecting electrodes of the LED chips are bonded to the flexible substrate, the resultant products might have unsatisfactory results for the bond shear test (i.e., exhibiting a relatively low bonding or shear strength), and the electrodes might be easily separated from the flexible substrate after reflow soldering. Therefore, there is a need to improve the bonding strength of the connecting electrodes of the LED chips.

In addition, advancement in pixel of display monitors comes along with LED chips having a smaller pixel pitch and smaller size. With the size of the LED chips being reduced, an area on the connecting electrodes available for forming eutectic bonding is also reduced, which might adversely affect the strength of eutectic bonding. Therefore, there is a need to increase strength of eutectic bonding for LED chips with reduced size, and to enhance reliability of an eutectic system formed between the connecting electrodes and the substrate.

SUMMARY

Therefore, an object of the disclosure is to provide a light-emitting device that can alleviate at least one of the drawbacks of the prior art.

According to the disclosure, the light-emitting device includes a carrier substrate, at least one flip-chip light-emitting diode (LED) and an electrode unit. The flip-chip LED is mounted onto the carrier substrate. The electrode unit is disposed between the carrier substrate and the flip-chip LED, and includes a first connecting electrode and a second connecting electrode opposite in conductivity to the first connecting electrode. Each of the first and second connecting electrodes includes an intermediate metal layer and a binding layer that are sequentially disposed on the flip-chip LED in such order. The binding layer includes a first portion that is adjacent to the carrier substrate and that forms an eutectic system with tin, and a second portion that is located between the first portion and the intermediate metal layer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
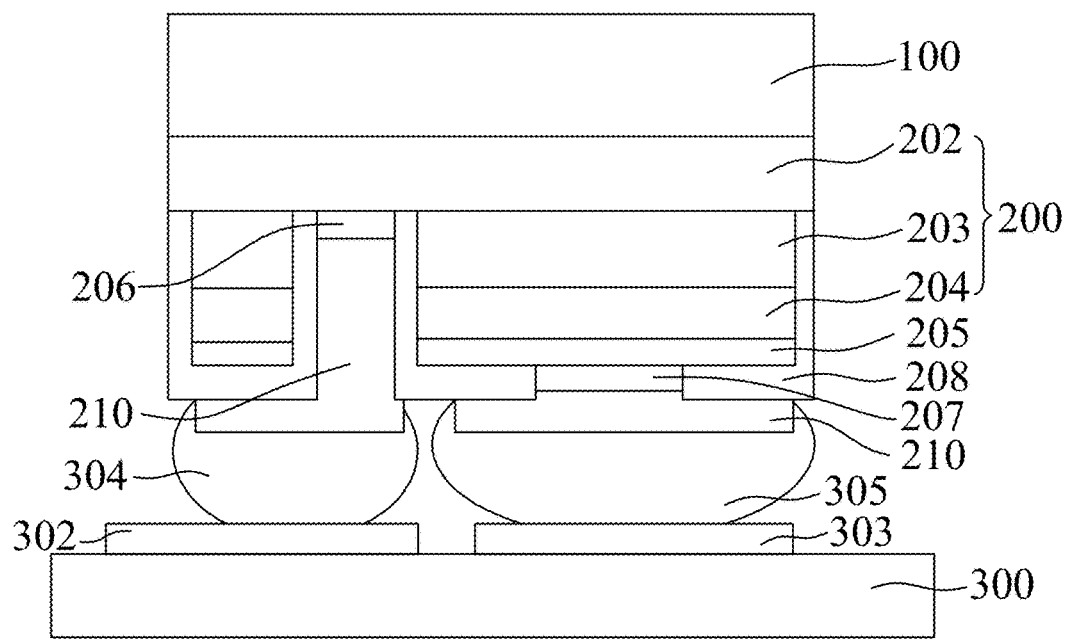
FIG. 1 is a schematic view illustrating a first embodiment of a light-emitting device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
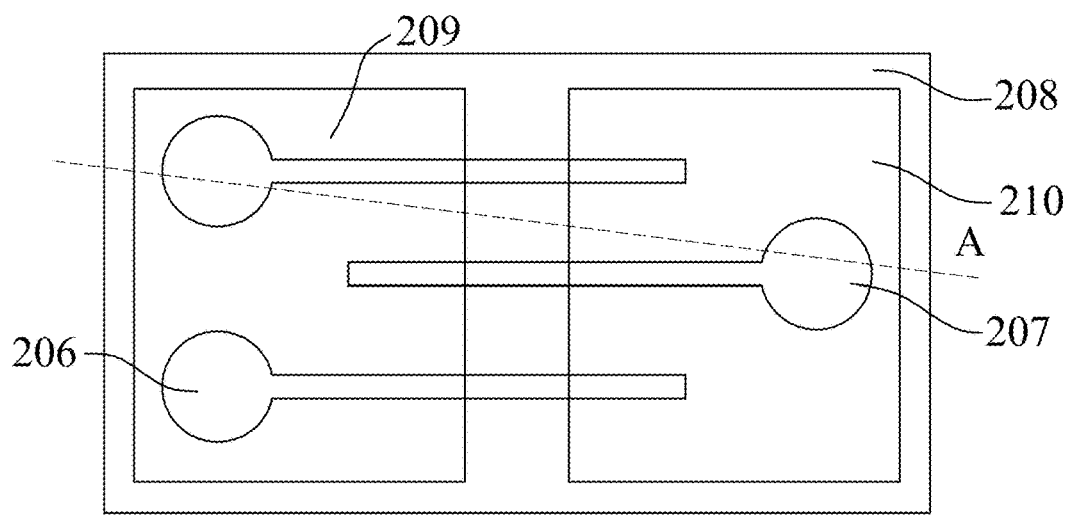
FIG. 2 is a top perspective schematic view illustrating the first embodiment of the light-emitting device.
Figure 3:
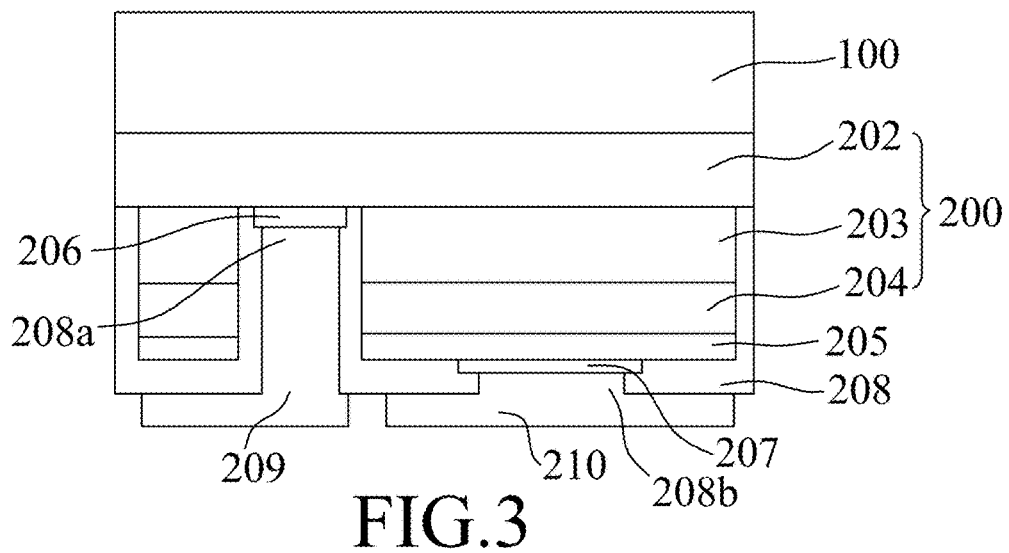
FIG. 3 is a cross-sectional schematic view taken along line A of FIG. 2, illustrating a flip-chip light-emitting diode (LED) and an electrode unit of the first embodiment.

Referring to FIGS. 1 to 3, a first embodiment of a light-emitting device according to the disclosure includes a carrier substrate 300, a flip-chip light-emitting diode (LED), and an electrode unit.

The carrier substrate 300 includes a first packaging electrode 302 and a second packaging electrode 303 that are used for bonding with the flip-chip LED.

The carrier substrate 300 may be chosen according to practical needs. In certain embodiments, the carrier substrate 300 is a packaging substrate. The packaging substrate may be a flexible substrate, such as a flexible printed circuit board (FPC) for flexible light strap, a FR-4 flexible substrate, or an aluminum-based substrate for chip-on-board (COB) LED. In other embodiments, the carrier substrate 300 is a circuit board. The circuit board may be a printed circuit board (PCB), and may be made of a polyimide-based or polyester-based material.

The flip-chip LED is mounted onto the carrier substrate 300 via at least one solder paste (two solder pastes 304, 305 illustrated in the figures). The flip-chip LED includes a substrate 100 and an epitaxial structure 200 disposed between the substrate 100 and the carrier substrate 300.

The substrate 100 may be a transparent substrate that is formed with a plurality of protrusions. For instance, the substrate 100 may be a patterned sapphire substrate. In certain embodiments, the substrate 100 serves as a growth substrate for the epitaxial structure 200. In other embodiments, the sapphire substrate merely serves as a bonding substrate on which the epitaxial structure 200 transferred from a growth substrate is disposed.

Each of the length and width of the epitaxial structure 200 may be less than 300 μm (such as 100 μm to 300 μm, or 100 μm to 200 μm), or may be not greater than 100 μm, such as not less than 40 μm. When the epitaxial structure 200 has a dimension of not greater than 100 μm×100 μm, the substrate 100 may be optionally dispensed with. The epitaxial structure 200 may have a thickness ranging from 1 μm to 8 μm. With the epitaxial structure 200 in the abovementioned range of length, width and thickness, the flip-chip LED may be manufactured into the light-emitting device with a relatively small or/and thin size. The flip-chip LED may include a plurality of the epitaxial structures 200 which may be electrically connected to each other in series or in parallel.

The epitaxial structure 200 may be formed on the substrate 100 by a metal-organic chemical vapor deposition (MOCVD) process. In this embodiment, the epitaxial structure 200 includes a first semiconductor layer 202, an active layer 203 and a second semiconductor layer 204 that are sequentially disposed on the substrate 100 in such order. The first semiconductor layer 202 has a light existing surface opposite to the active layer 203. The first semiconductor layer 202 may be an n-type layer, and the second semiconductor layer may be a p-type layer, or vice versa. For emitting ultraviolet, blue or green light radiation, the epitaxial structure 200 may include a group III-V nitride-based semiconductor material, such as an Al/Ga/In nitride-based semiconductor material. For emitting red or infrared radiation, the epitaxial structure 200 may include an Al/Ga/In phosphide-based semiconductor material, or an Al/Ga/In arsenide-based semiconductor material.

In certain embodiments, the second semiconductor layer 204 may be covered with a metallic reflective layer, such as silver. The epitaxial structure 200 is formed with a recess to expose a portion of the first semiconductor layer 202 by etching the second semiconductor layer 204 and the active layer 203, and optionally, partially etching the first semiconductor layer 202. The recess is defined by a recess-defining wall.

The epitaxial structure 200 may further include a transparent conducting layer 205 disposed on the second semiconductor layer 204 opposite to the substrate 100. The transparent conducting layer 205 is configured to have ohmic contact and thus, improves current spreading.

The flip chip LED may further include a passivation layer 208 covering a top surface of the epitaxial structure 200 opposite to the light existing surface and the recess-defining wall. The passivation layer 208 is formed with a first through hole 208a on the exposed first semiconductor layer 202, and a second through hole 208b on the first semiconductor layer 204. In certain embodiments, the passivation layer 208 is transparent. In other embodiments, the passivation layer 208 is made of a reflective material. For example, the passivation layer 208 may be a distributed Bragg reflector (DBR).

The electrode unit is disposed between the carrier substrate 300 and the flip-chip LED, and includes a first electrode 206 disposed on the exposed first semiconductor layer 202, and a second electrode 207 disposed on the transparent conducting layer 205 opposite to the substrate 100.

The electrode unit further includes a first connecting electrode 209 and a second connecting electrode 210 having a conductivity opposite to that of the first connecting electrode 209. The first connecting electrode 209 is electrically connected to the first semiconductor layer 202 and the first electrode 206 through the first through hole 208a of the passivation layer 208. The second connecting electrode 210 is electrically connected to the second semiconductor layer 204 and the second electrode 207 through the second through hole 208b. The first and second connecting electrodes 209, 210 are substantially flush with each other, and are spaced apart by a predetermined distance.

Figure 4:
FIG. 4 is a schematic view illustrating the electrode unit of the first embodiment in a multi-layered structure.

Each of the first and second connecting electrodes 209, 210 may be formed as a multi-layered structure by, e.g., sputtering deposition. Referring to FIG. 4, in this embodiment, each of the first and second connecting electrodes 209, 210 includes an intermediate metal layer and a binding layer 210c that are sequentially disposed on the flip-chip LED in such order.

For each of the first and second connecting electrodes 209, 210, the intermediate metal layer may include at least one functional sublayer selected from a stress relieving sublayer 210a, a stress transition sublayer 210b, and a reflective sublayer. In this embodiment, the intermediate metal layer includes both the stress relieving sublayer 210a and the stress transition sublayer 210b.

The stress relieving sublayer 210a may relieve stress generated during formation of the binding layer 210c, as too large stress may introduce cracks in the first and/or second connecting electrodes 209, 210, and may lead to leakage of electricity, thereby reducing the quality of the resultant light-emitting device. The stress relieving sublayer 210a may be made of a material selected from the group consisting of titanium, aluminum, copper, gold and combinations thereof.

In certain embodiments, the stress relieving sublayer 210a of the second connecting electrode 210 may be configured for reflecting light emitted from the active layer 203 with a reflectance of, e.g., not less than 80%. Alternatively, the second connecting electrode 210 may further include an additional reflecting sublayer that is formed between the epitaxial structure 200 and the stress relieving sublayer 210a so as to provide enhanced reflection effect.

The stress transition sublayer 210b is disposed between the stress relieving sublayer 210a and the binding layer 210c. The stress transition sublayer 210b may be used to provide a good stress transition between the stress relieving sublayer 210a and the binding layer 210c, and to enhance binding there between. The stress transition sublayer 210b may be made of one of titanium, chromium and a combination thereof.

For each of the first and second connecting electrodes 209, 210, the binding layer 210c includes a first portion 210c1 and a second portion 210c2. The first portion 210c1 is adjacent to the solder pastes 304, 305, and forms an eutectic system with tin during a reflow process. The second portion 210c2 is located between the first portion 210c1 and the intermediate metal layer.

Referring to FIGS. 1 and 4, the first connecting electrode 209 is bonded to the first packaging electrode 302 via the solder paste 304, and the second connecting electrode 210 is bonded to the second packaging electrode 303 via the solder paste 305. The solder paste 304 covers a side surface of the first connecting electrode 209, and the solder paste 305 covers a side surface of the second connecting electrode 210. The carrier substrate 300 and the flip-chip LED mounted onto the carrier substrate 300 are then subjected to a reflow process at a temperature in accordance with melting point of the solder paste used, usually ranging from 150° C. to 270° C., thereby permitting the first portion 210c to form the eutectic system with tin. The tin for forming the eutectic system may be from the solder pastes 304, 305 and/or the electrode unit. In this embodiment, the solder pastes 304, 305 are made of a material containing tin to form the eutectic system with the binding layer 210c of each of the first and second connecting electrodes 209, 210. Examples of a material for making the solder pastes 304, 305 may include, but are not limited to, tin-silver alloy, tin-bismuth alloy, tin-zinc alloy, tin-silver-copper alloy, tin-copper alloy, tin-gold alloy. In certain embodiments, the solder pastes 304, 305 may be omitted, and the first connecting electrode 209 and/or the second connecting electrode 210 may include tin to form the eutectic system. In other embodiments, the second portion 210c2 of the binding layer 210c is made of a material free from tin.

The second portion 210c2 positioned in between the intermediate metal layer and the first portion 210c1 may avoid direct contact between the eutectic system and the intermediate metal layer, so as to prevent malfunction of the light-emitting device due to diffusion of tin from the first portion 210c1 to the intermediate metal layer, or even the epitaxial structure 200. In addition, the second portion 210c2 may also maintain an interfacial bonding between the binding layer 210c and the intermediate metal layer, thereby enhancing die bonding and shear strength of the light-emitting device.

Figure 7:
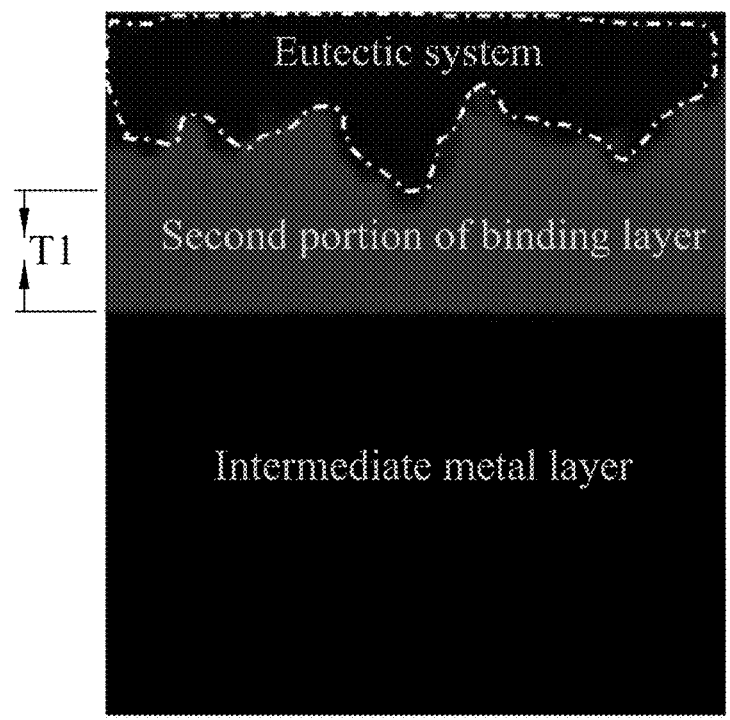
FIG. 7 is a focus ion beam scanning electron microscopes (FIB-SEM) graph of the electrode unit of the light-emitting device of E3 having the binding layer with a thickness of 750 nm.

Specifically, referring to FIG. 7, due to the uneven diffusion of tin during the formation of the eutectic system, the interface between the first portion 210c1 and the second portion 210c2 of the binding layer 210c may be uneven, and the second portion 210c2 has a minimal thickness (T1) of at least 50 nm, so as to prevent the diffusion of tin from the first portion 210c1 to the intermediate metal layer, or even to the epitaxial structure 200. In other embodiments, the minimal thickness (T1) of the second portion 210c2 is not greater than 300 nm, as the second portion 210c2 with too large thickness may generate a relatively large stress in the first and second connecting electrodes 209, 210, resulting in cracking thereof and achieving no further improvement in die bonding or shear strength of the light-emitting device.

Figure 5:
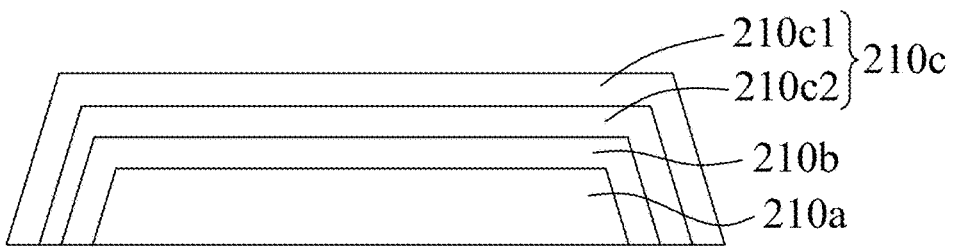
FIG. 5 is a schematic view illustrating the electrode unit of a variation of the first embodiment in a multi-layered structure.

Referring to FIG. 5, to effectively block diffusion of tin into the intermediate metal layer, in a variation of the first embodiment, for each of the first and second connecting electrodes 209, 210, the eutectic system and the second portion 210c2 of the binding layer 210c may be further disposed on a lateral surface of the intermediate metal layer through repeated coating processes and patterned masks. As compared with electroplating, the intermediate metal layer and the binding layer 210c which are formed by evaporation deposition would be more compact and smoother, so as to further enhance the binding strength between the intermediate metal layer and the binding layer 210c.

For each of the first and second connecting electrodes 209, the binding layer 210c include nickel (Ni) or an alloy in which nickel is present in an amount of greater than 50% by mass. The binding layer 210c maybe a nickel layer.

In certain embodiments, the binding layer 210c is formed as a composite metal structure. For example, the composite metal structure may include at least two nickel layers, and an additional metal layer such as titanium (Ti) or gold (Au) layer interposed between the two nickel layers. In a case of the composite metal structure includes a plurality of the nickel layers and a plurality of the additional metal layers that are alternately stacked, a total thickness of the nickel layers is greater than that of the additional metal layers. When the first bonding electrode 209 and the second bonding electrode 210 are bonded to a packaging substrate or an application substrate by reflow soldering through a solder paste, one of the nickel layers that is the most proximal to the intermediate metal layer does not form eutectic system with tin, while the remaining nickel layers and the additional metal layers in the composite metal structure form eutectic system with tin.

To further demonstrate the effect of the second portion 210c2, three examples, i.e., Examples 1 to 3 (E1-E3) of the light-emitting devices having the configuration shown in FIG. 1 with varied thickness of the binding layers 210c are prepared as follows.

To be specific, the electrode unit is disposed on the flip-chip LED. For each of the first and second connecting electrodes 209, 210 of the electrode unit, the binding layer 210c has a thickness of 300 nm and is made of Ni, the stress relieving sublayer 210a is made of Al, and the stress transition sublayer 210b is made of Ti. Then, the electrode unit disposed on the flip-chip LED is mounted onto a FPC substrate serving as the carrier substrate 300 through a tin-silver-copper solder paste by performing reflow soldering twice at 270° C., after which the binding layer 210c is formed into a first portion 210c1 that is adjacent to the solder paste and that forms an eutectic system with tin from the solder paste, and the second portion 210c2 located between the first portion 210c1 and the stress transition sublayer 210b, thereby obtaining the light-emitting device of E1.

The light-emitting devices of E2 and E3 are prepared by procedures generally similar to those of E1, except that the thickness of the binding layer of each of the first and second connecting electrodes 209, 210 being 500 nm in E2, and being 750 nm in E3.

The light-emitting devices of E1 to E3 are subjected to a bond shear test, so as to determine the shear strength. The relative shear strengths of E1 to E3 (relative to the shear strength of E1) are calculated, and the result is shown in FIG. 6.

Figure 6:
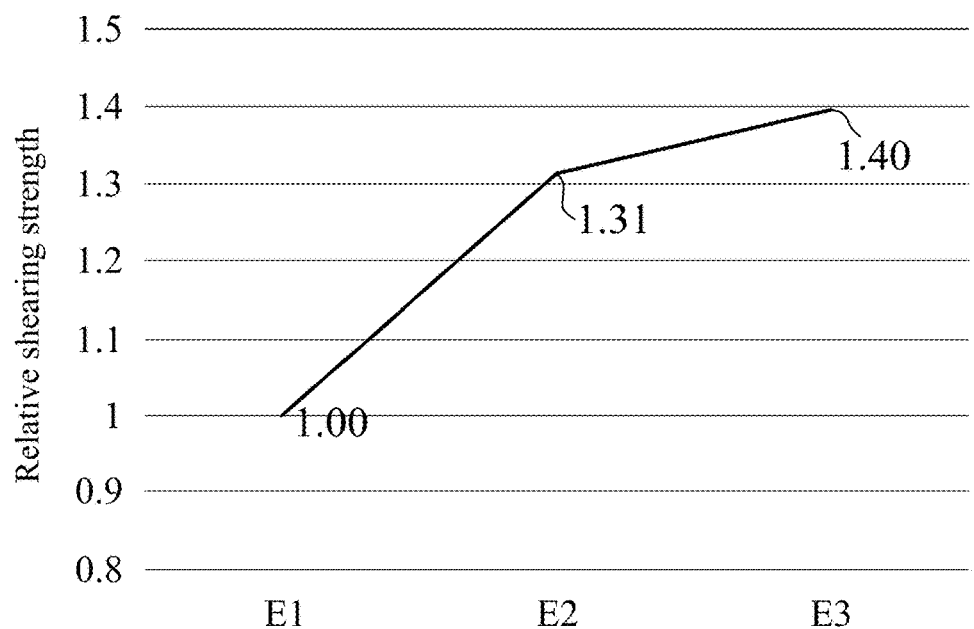
FIG. 6 is a graph showing relative shear strength of the light-emitting devices of Examples 1 to 3 (E1 to E3)

As shown in FIG. 6, the light-emitting device of E2 having the binding layers 210c thicker than that of E1 are capable of forming thicker eutectic systems so as to improve die bonding, thereby having a greater shear strength. Similarly, the light-emitting device of E3 exhibits a further improved shear strength compared to that of E2, indicating that the shear strength of the light-emitting device increases with increased thickness of the binding layer 210c.

The binding layer 210c of E3 is subjected to a focus ion beam scanning electron microscopes (FIB-SEM) in combination with an energy dispersive X-Ray (EDX) analysis, and the result is shown in FIG. 7. The eutectic system formed in the first portion 210c1 of E3 has an average thickness of approximately 500 nm, while the remaining portion of the binding layer 210c serving as the second portion 210c2 has a minimal thickness of T1, and is capable of blocking diffusion of tin to reach the intermediate metal layer, and maintaining interfacial bonding between the intermediate metal layer and the binding layer 210c.

Figure 8:
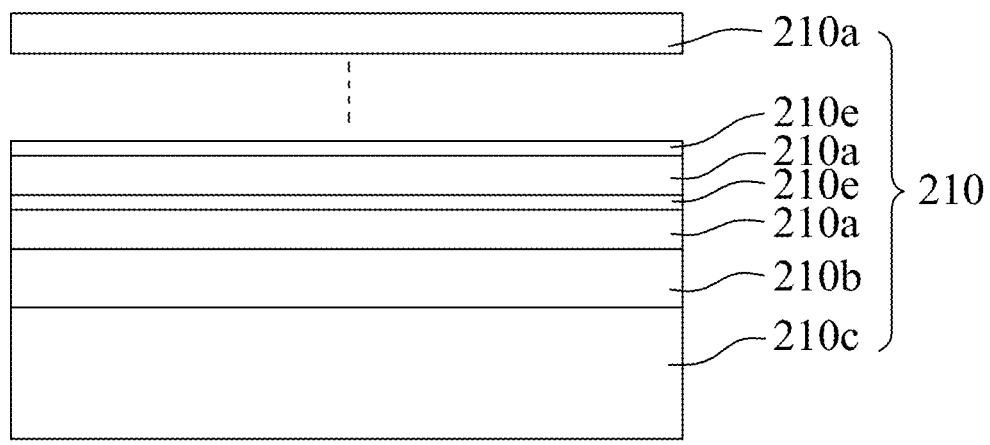
FIG. 8 is a schematic view illustrating the binding layer of a second embodiment of the light-emitting device according to the disclosure.

Referring to FIG. 8, a second embodiment of the light-emitting device is generally similar to the first embodiment, except that in the second embodiment, for each of the first and second connecting electrodes 209, 210, the intermediate metal layer includes a plurality of the stress relieving sublayers 210a, and at least one migration resisting sublayer 210e is interposed between two immediately adjacent ones of the stress relieving sublayers 210a. The migration resisting sublayer 210e is configured to avoid migration of the material of the stress relieving sublayers 210a. A ratio of a thickness of the migration resisting layer 210e to a thickness of each of the stress relieving sublayer 210a may be not greater than 1:3. When the migration resisting sublayer 210e is too thick, the stress relieving ability of the stress relieving sublayers 210a may be undesirably reduced, and resistance of the first and second connecting electrodes 209, 210 may be undesirably increased. The migration resisting sublayer 210e may be made of one of titanium, chromium and. In this embodiment, a number of the stress relieving sublayers 210a ranges from 3 to 5, each of which is made of Al and has a thickness ranging from 100 nm to 500 nm, and the migration resisting sublayer 210e is made of Ti.

Figure 9:
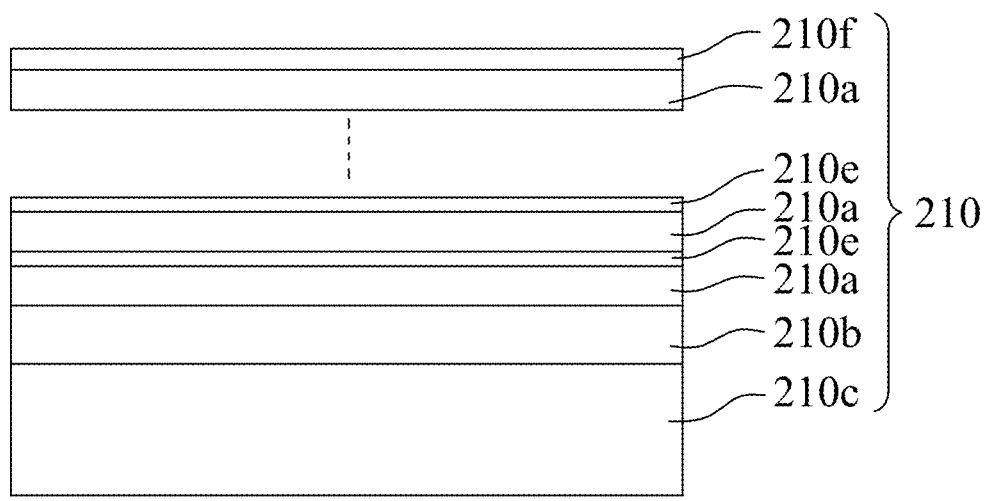
FIG. 9 is a schematic view illustrating the binding layer of a third embodiment of the light-emitting device according to the disclosure.

Referring to FIG. 9, a third embodiment of the light-emitting device is generally similar to the second embodiment, except that each of the first and second connecting electrodes 209, 210 in the third embodiment further includes an adhesive layer 210f that is disposed between the intermediate metal layer and the flip-chip LED, and that covers and directly contacts the passivation layer 208 (see FIG. 1). The adhesive layer 210f may have a thickness that is not greater than 5 nm, so as to minimize light absorption thereof. In certain embodiments, the adhesive layer 210f is made of Ti or Cr.

The light-emitting device according to the disclosure may include a plurality of flip-chip LEDs, which are high voltage flip-chip LEDs, and may be applied in high power devices such as lightings, backlights, RGB monitors and flexible light strips.

Figure 10:
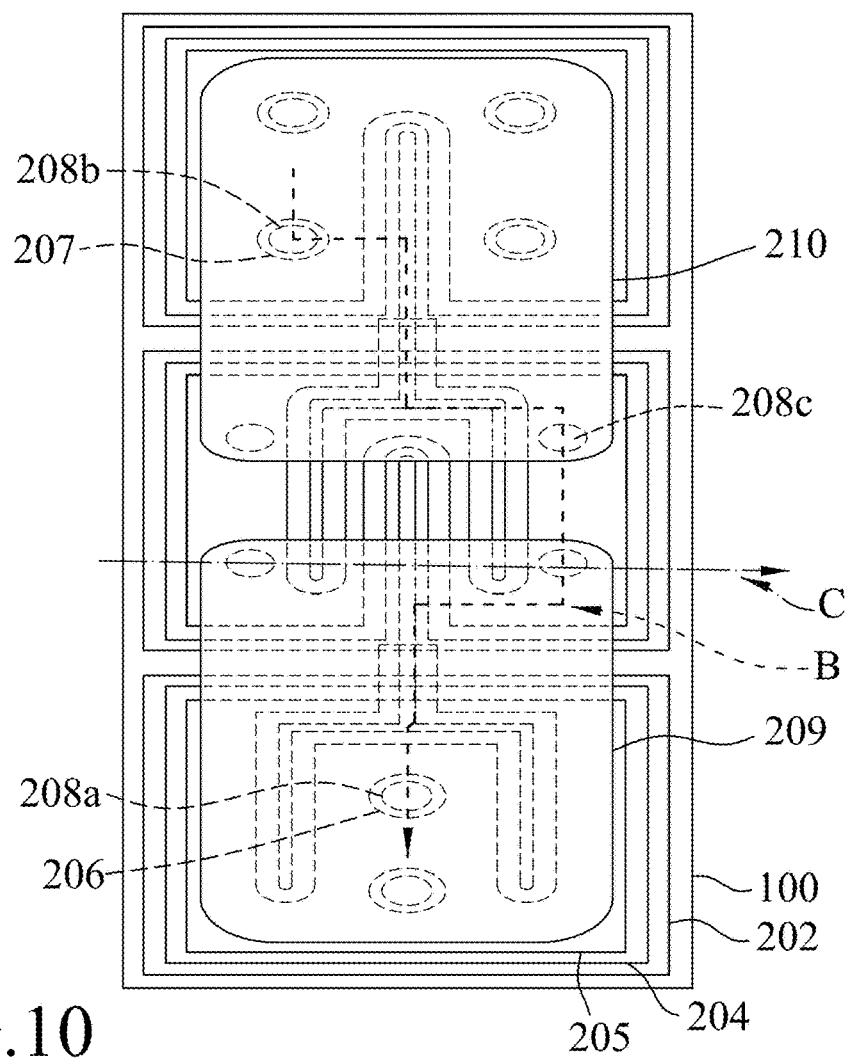
FIG. 10 is a top perspective schematic view illustrating a fourth embodiment of the light-emitting device.
Figure 11:
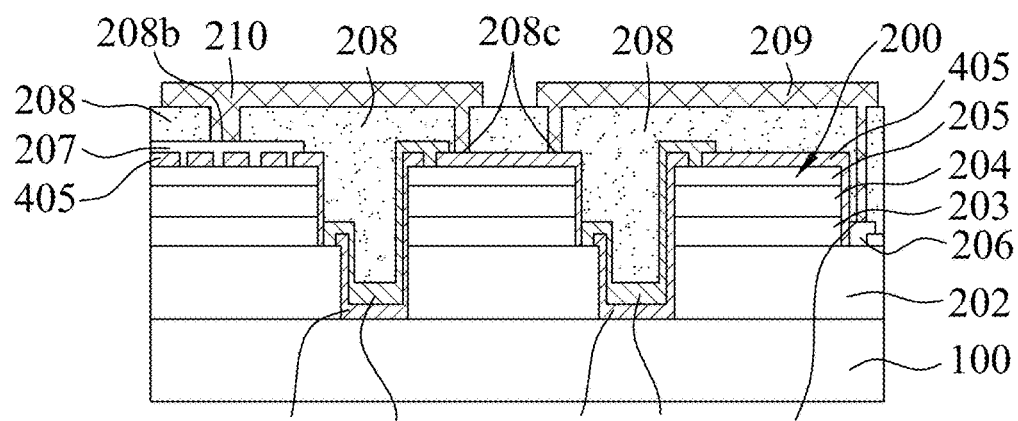
FIG. 11 is a cross-sectional schematic view taken along line B of FIG. 10, illustrating the flip-chip LED and the electrode unit of the fourth embodiment of the light-emitting device.
Figure 12:
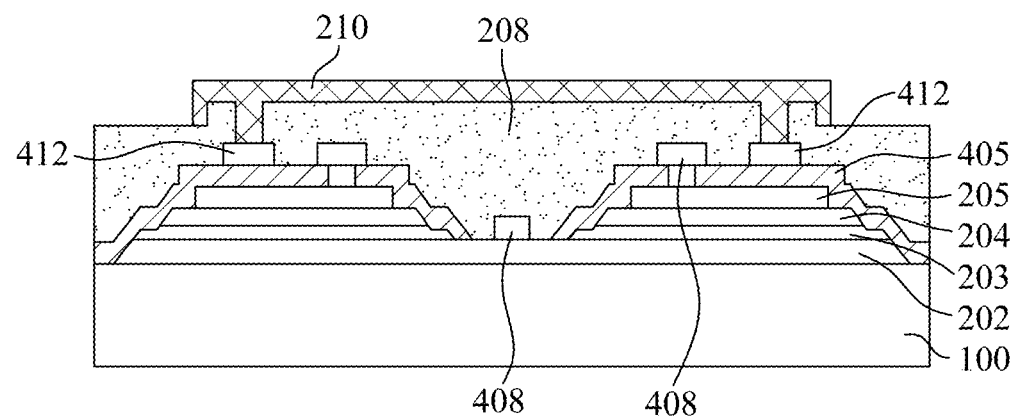
FIG. 12 is a cross-sectional schematic view taken along line C of FIG. 10, illustrating the flip-chip LED and the electrode unit of the fourth embodiment of the light-emitting device.

For example, referring to FIGS. 10 to 12, a fourth embodiment of the light-emitting device according to the disclosure includes three flip-chip LEDs that are spaced apart from one another by a trench, i.e., a first LED, another LED and a second LED in a direction from right to left as shown in FIG. 11, and is similar to the first embodiment except for the following difference. It should be noted that the carrier substrate 300 and the solder pastes 304, 305 are not shown in FIGS. 11 and 12 for sake of brevity.

To be specific, in the fourth embodiment, the light-emitting device further includes an insulating layer 405 that is light-transmissive, and that is conformally formed on the LEDs and in the trench. The insulating layer 405 serves as a current blocking layer. The insulating layer 405 is formed with a plurality of openings which expose portions of the first semiconductor layer 202 and the second semiconductor layer 204 of each of the three LEDs. With such configuration, the insulating layer 405 provides insulation protection to parts of the LEDs and the trench that are not in contact with the electrode unit. The insulating layer 405 may be made of silicon dioxide ($SiO_2$) or silicon nitrides ($Si_3N_4$), etc. The insulating layer 405 may have a thickness ranging from 100 nm to 1000 nm.

On the first LED, the first electrode 206 is disposed on the insulating layer 405, and fills the openings to be electrically connected to the first semiconductor layer 202. On the second LED, the second electrode 207 is disposed on the insulating layer 405, and fills the openings to be electrically connected to the second semiconductor layer 204.

The electrode unit further includes a plurality of interconnect electrodes 408 (two exemplified in the fourth embodiment) which are disposed on the insulating layer 405 on the trench, and which fill the openings that are not filled by any one of the first electrode 206 and the second electrode 207 so as to electrically connect two immediately adjacent ones of the LEDs to each other. That is, one of the interconnect electrodes 408 electrically connects the transparent conducting layer 205 of the first LED to the first semiconductor layer 202 of the another LED, and the other one of the interconnect electrodes 408 electrically connects the transparent conducting layer 205 of the another LED to the first semiconductor layer 202 of the second LED. The interconnect electrode 408 may be made of a material identical to that of the first and second electrodes 206, 207.

The passivation layer 208 may be a reflective layer which fills the trench and which covers each of the three LEDs, the first electrode 206, the second electrode 207 and the interconnect electrodes 408. The reflective layer may have a thickness ranging from 2 μm to 6 μm. In certain embodiments, the reflective layer is a distributed Bragg reflector.

The reflective layer is formed with the first through hole 208a to expose the first electrode 206 on the first LED, and the second through hole 208b to expose the second electrode 207 on the second LED. The first connecting electrode 209 is disposed on the reflective layer, and fills the first through hole 208a to be electrically connected to the first semiconductor layer 202 of the first LED. The second connecting electrode 210 is disposed on the reflective layer, and fills the second through hole 208b to be electrically connected to the second semiconductor layer 204 of the second LED. The first connecting electrode 209 and/or the second connecting electrode 209, 210 may be also configured to reflect and/or diffract light, so as to reduce loss of light from the LEDs. An area of a projection of the first through hole 208a on the substrate 100 may account for not greater than 20% of an area of a projection of the first LED on the substrate 100. An area of a projection of the second through hole 208b on the substrate 100 may account for not greater than 20% of an area of a projection of the second LED on the substrate 100.

The reflective layer may be further formed with a hole structure 208c on the another LED. The hole structure 208c may include at least one first hole that is filled by the first connecting electrode 209, and at least one second holes that is filled by the second connecting electrode 210. The first and second holes of the hole structure 208c may be independently a through hole that penetrate through the reflective layer to expose the insulating layer 405. Alternatively, each of the first and second holes of the hole structure 208c may not be a through hole, i.e., bottoms of the holes are located within the reflective layer. The hole structure 208c may increase the binding areas of the first and second connecting electrodes 209, 210 to the LEDs (particularly the another LED), thereby further improving die bonding and shear strength of the light-emitting device and ensuring reliability of the light-emitting device. Moreover, forming the hole structure 208c on the another LED instead of on the first and second LEDs may avoid further reduction of reflecting area available for the first and second LEDs due to the through holes, so that a more uniform light emission from each of the LEDs may be achieved, and each of the LEDs may receive a similar pressure during the die bonding process.

In certain embodiments, the hole structure 208c includes a plurality of the first holes, and a plurality of the second holes that may be equally spaced apart from one another. A total number of the first and second holes may range from 2 to 40. Each of the first and second holes may be independently formed as one of a cylinder shape (with a circular cross-section) and a frustoconical shape (with a polygonal cross-section). Each of the first and second holes may independently have an average diameter ranging from 2 µm to 40 µm, such as 10 µm to 30 µm. An area of a projection of the first holes (or the second holes) on the substrate 100 accounts for not greater than 20%, such as from 5% to 15% of an area of a projection of the another LED on the substrate 100, so as to improve die bonding while minimizing light loss. In addition, a total area of projections of the first and second holes on the substrate 100 may be substantially identical to an area of the projection of the first through hole 208a on the substrate 100.

In a case of the light-emitting device including an even number of the another LEDs, the reflective layer on each of a half of the another LEDs is formed with only the first holes, and the reflective layer on each of the other half of the another LEDs is formed with only the second holes. For each of the half of the another LEDs, the number of the first holes is the same, and for each of the other half of the another LEDs, the number of the second holes is the same.

In a case of the light-emitting device including at least three and an odd number of the another LEDs, the reflective layer on one of the another LEDs is formed with at least one the first hole and at least one the second hole. With respect to the remaining of the another LEDs, the reflective layer on each of a half of the another LEDs is only formed with the first holes, and the reflective layer on the other half of the another LEDs is formed with only the second holes. For each of the half of the another LEDs, the number of the first holes is the same, and for each of the other half of the another LEDs, the number of the second holes is the same.

Referring to FIG. 12, the fourth embodiment of the light-emitting device further includes metal pads 412 which are disposed between the insulating layer 405 and the reflective layer on the another LED, which correspond in position to the first and second holes, and which are spaced apart from the interconnect electrodes 408. The first connecting electrode 209 may fill the first holes to contact with the metal pad(s) 412, and the second connecting electrode 210 may fill the second holes to contact with the metal pad(s) 412.

In certain embodiments, the metal pads 412 are made of a reflective metallic material (such as aluminum or silver), and thus are capable of reflecting light so as to increase light-emitting efficiency of the light-emitting device. In other embodiments, each of the first and second connecting electrodes 209, 210 may further include a reflecting sublayer proximal to the reflective layer, such as an aluminum mirror or a silver mirror.

The fourth embodiment may be manufactured as follows.

To be specific, a light-emitting semiconductor unit which includes the first semiconductor layer 202, the active layer 203 and the second semiconductor layer 204 sequentially disposed on the substrate 100 in such order is formed by a metal-organic chemical vapor deposition (MOCVD) process. The light-emitting semiconductor unit is etched to form a plurality of recesses that expose the first semiconductor layer 202, and then etched again to form the trench that exposes the substrate 100, such that the light-emitting semiconductor unit are divided into a plurality of LEDs (i.e., the first, second and another LEDs in this embodiment) that are separated from one another by the trench. Afterwards, the transparent conducting layer 205 is formed on the second semiconductor layer 204 of each of the LEDs. The insulating layer 405 is conformally formed on the LEDs and in the trench by, for instance, a plasma enhanced chemical vapor deposition (PECVD) process. The insulating layer 405 is then etched to form the openings that expose a portion of the transparent conducting layer 205 and a portion of the first semiconductor layer 202 for each of the LEDs. The first electrode 206 is formed by filling the opening that exposes the first semiconductor layer 202 of the first LED. The second electrode 207 is formed by filling the opening that exposes the transparent conducting layer 205 of the second LED. The first and second electrodes 206, 207 may further extend to respectively cover the insulating layer 405 of the first LED and the second LED. The interconnect electrodes 408 are formed in the trench, and extends to fill the remainder of the openings so as to electrically connect two immediately adjacent ones of the LEDs to each other. The metal pads 412 are formed on the insulating layer 405 on the another LED, and are spaced apart from the interconnect electrodes 408. It should be noted that the first connecting electrode 206, the second connecting electrode 207, the connecting electrodes 408 and the metal pads 412 may be formed simultaneously or sequentially.

Next, the passivation layer 208 (i.e., the reflective layer in this embodiment) is formed to cover the transparent conducting layer 205, the first and second electrodes 206, 207, the interconnect electrodes 408, the metal pads 412, the LEDs and the trench. The reflective layer is etched to form the first through hole 208a, the second through hole 208b and the hole structure 208c respectively on the first, second and another LEDs. The first connecting electrode 209 is formed by, e.g., sputtering deposition, or evaporation deposition, and fills the first through hole 208a to be electrically connected to the first semiconductor layer 202 of the first LED. The first connecting electrode 209 may further extend to cover the reflective layer of the another LED, and to fill the first hole of the hole structure 208c. The second connecting electrode 210 is formed by, e.g., sputtering deposition, or evaporation deposition, and fills the second through hole 208b to be electrically connected to the second semiconductor layer 204 of the second LED. The second connecting electrode 210 may further extend to cover the reflective layer of the another LED, and to fill the second hole of the hole structure 208c. The first and second connecting electrodes 209, 210 are then bonded to the carrier substrate 300 through the solder pastes 304, 305 (not shown in FIG. 11) so as to obtain the light-emitting device.

Figure 14:
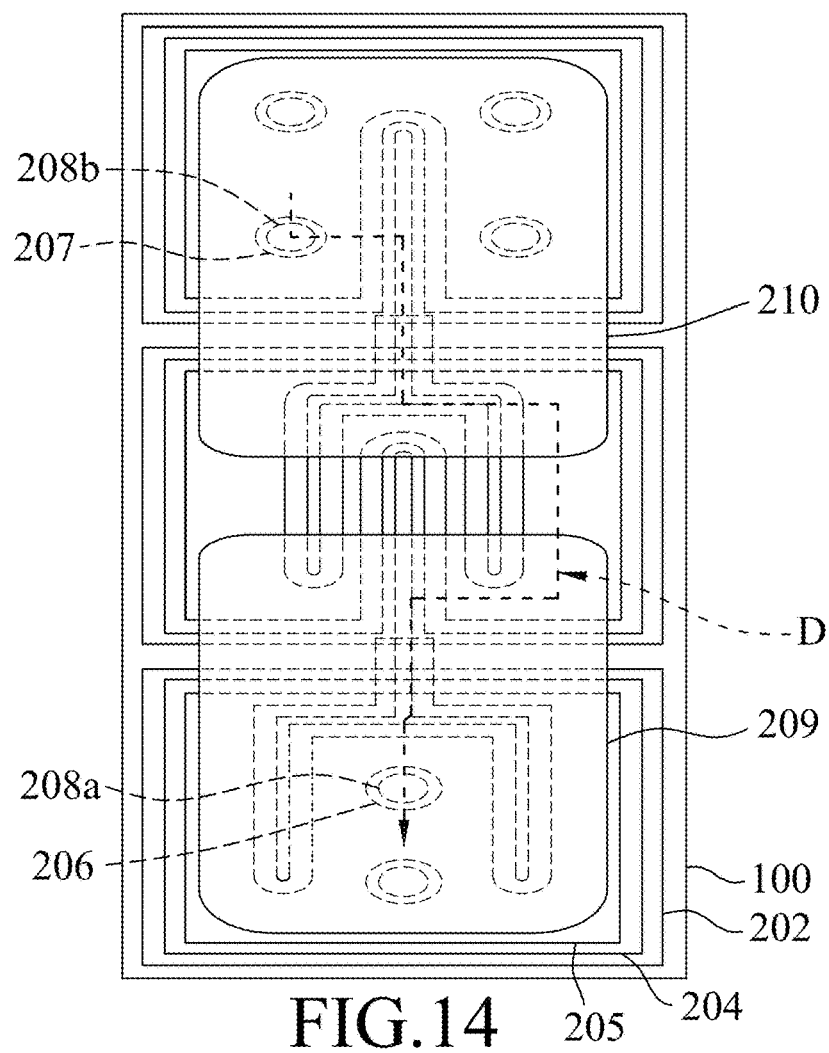
FIG. 14 is a top perspective schematic view illustrating a variation of fourth embodiment of the light-emitting device.
Figure 15:
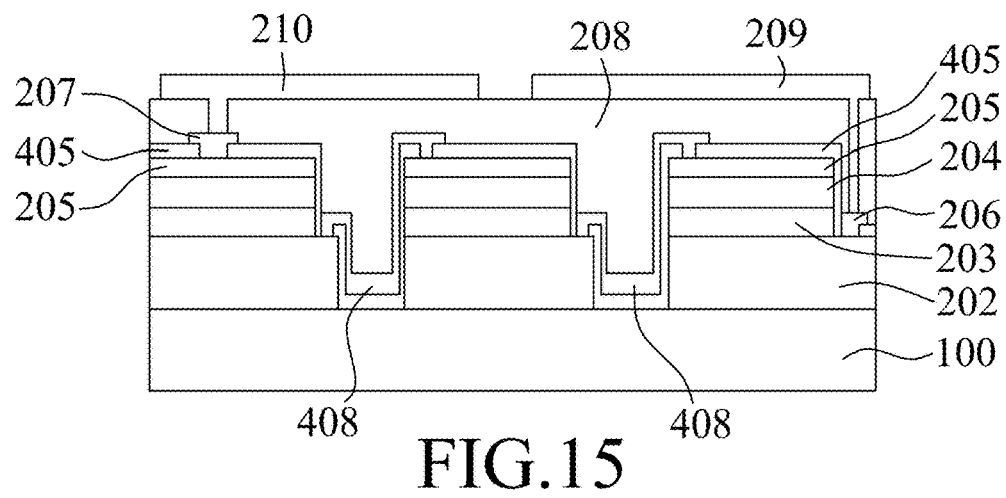
FIG. 15 is a cross-sectional schematic view taken along line D of FIG. 14, illustrating the flip-chip LED and the electrode unit of the variation of fourth embodiment.

Referring to FIGS. 14 and 15, a variation of the fourth embodiment of the light-emitting is provided, and has a configuration generally similar to the fourth embodiment, except that the reflective layer is not formed with any hole structure 208c to be filled by the first and second connecting electrodes 209, 210.

Figure 13:
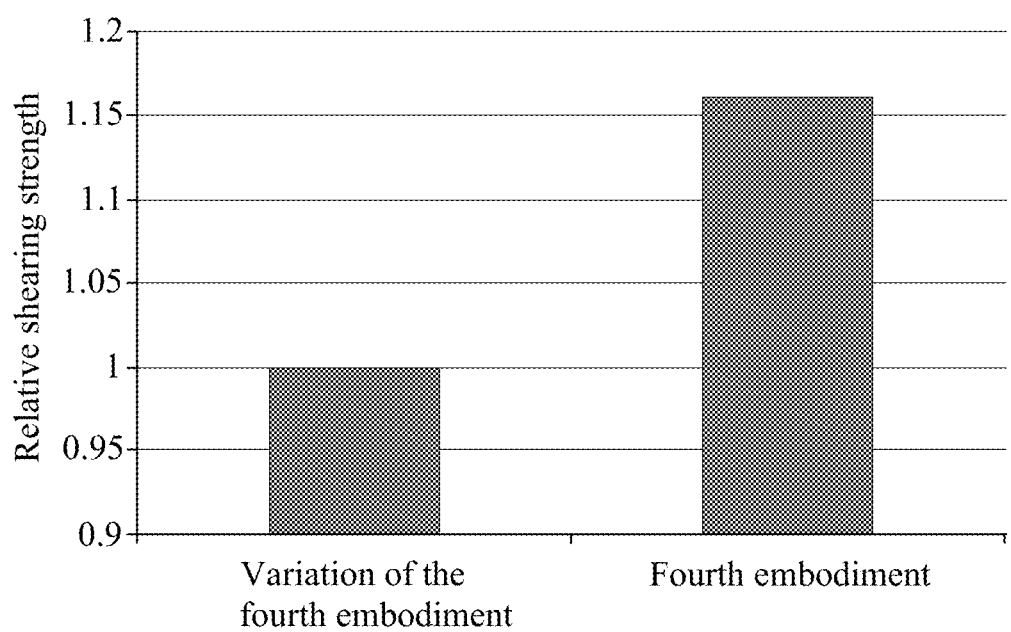
FIG. 13 is a graph showing relative shearing strength of a conventional LED device and that of the fourth embodiment of the light-emitting device.

The fourth embodiment and the variation thereof are subjected to a bond shear test so as to determine the shear strength thereof. As shown in FIG. 13, the fourth embodiment has a shear strength that is approximately 1.16 times of that of the variation, indicating that the hole structures 208c that are formed on the another LED and that are filled by the first and/or second connecting electrodes 209, 210 may further enhance shear strength of the light-emitting device.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment, "an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting device, comprising:
a carrier substrate;
at least one flip-chip light-emitting diode (LED) which is mounted onto said carrier substrate; and
an electrode unit which is disposed between said carrier substrate and said flip-chip LED, and which includes a first connecting electrode and a second connecting electrode opposite in conductivity to said first connecting electrode,
wherein each of said first connecting electrode and said second connecting electrode includes an intermediate metal layer and a binding layer that are sequentially disposed on said flip-chip LED in such order, said binding layer including a first portion that is adjacent to said carrier substrate and that forms an eutectic system with tin, and a second portion that is located between said first portion and said intermediate metal layer,
wherein said second portion of said binding layer is made of a material free of tin, and
wherein for each of said first connecting electrode and said second connecting electrode, said intermediate metal layer includes a plurality of stress relieving sublayers, and at least one migration resisting sublayer, said at least one migration resisting sublayer being interposed between any two immediately adjacent ones of said plurality of stress relieving sublayers.

2. The light-emitting device of claim 1, wherein for each of said first connecting electrode and said second connecting electrode, said second portion of said binding layer has a minimal thickness ranging from 50 nm to 300 nm.

3. The light-emitting device of claim 1, wherein for each of said first connecting electrode and said second connecting electrode, said second portion of said binding layer includes nickel.

4. The light-emitting device of claim 1, wherein for each of said first connecting electrode and said second connecting electrode, said eutectic system and said second portion of said binding layer are further disposed on a lateral surface of said intermediate metal layer.

5. The light-emitting device of claim 1, wherein said carrier substrate is a packaging substrate.

6. The light-emitting device of claim 1, wherein said carrier substrate is a circuit board.

7. The light-emitting device of claim 1, wherein said carrier substrate is a flexible substrate.

8. The light-emitting device of claim 1, wherein said at least one flip-chip LED is mounted onto said carrier substrate via a solder paste, and said solder paste is made of a material containing tin to form the eutectic system with said first portion of each of said first connecting electrode and said second connecting electrode.

9. A light-emitting device, comprising:
a carrier substrate;
at least one flip-chip light-emitting diode (LED) which is mounted onto said carrier substrate; and
an electrode unit which is disposed between said carrier substrate and said flip-chip LED, and which includes a first connecting electrode and a second connecting electrode opposite in conductivity to said first connecting electrode,
wherein each of said first connecting electrode and said second connecting electrode includes an intermediate metal layer and a binding layer that are sequentially disposed on said flip-chip LED in such order, said binding layer including a first portion that is adjacent to said carrier substrate and that forms an eutectic system with tin, and a second portion that is located between said first portion and said intermediate metal layer, and
wherein for each of said first connecting electrode and said second connecting electrode, said intermediate metal layer includes at least one functional sublayer selected from a stress relieving sublayer, a stress transition sublayer, and a reflective sublayer.

10. The light-emitting device of claim 9, wherein for each of said first connecting electrode and said second connecting electrode, said intermediate metal layer includes said stress relieving sublayer which is made of a material selected from the group consisting of titanium, aluminum, copper, gold and combinations thereof.

11. The light-emitting device of claim 9, wherein for each of said first connecting electrode and said second connecting electrode, said intermediate metal layer includes said stress relieving sublayer and said stress transition sublayer disposed between said stress relieving sublayer and said second portion.

12. The light-emitting device of claim 11, wherein for each of said first connecting electrode and said second connecting electrode, said stress transition sublayer is made of one of titanium, chromium and a combination thereof.

13. The light-emitting device of claim 9, wherein for each of said first connecting electrode and said second connecting electrode, said intermediate metal layer includes a plurality of stress relieving sublayers, a number of said stress relieving sublayers ranging from 3 to 5, each of said stress relieving sublayers having a thickness ranging from 100 nm to 500 nm.

14. A light-emitting device, comprising:
a carrier substrate;
at least one flip-chip light-emitting diode (LED) which is mounted onto said carrier substrate; and
an electrode unit which is disposed between said carrier substrate and said flip-chip LED, and which includes a first connecting electrode and a second connecting electrode opposite in conductivity to said first connecting electrode,
wherein each of said first connecting electrode and said second connecting electrode includes an intermediate metal layer and a binding layer that are sequentially disposed on said flip-chip LED in such order, said binding layer including a first portion that is adjacent to said carrier substrate and that forms an eutectic system with tin, and a second portion that is located between said first portion and said intermediate metal layer, and
wherein for each of said first connecting electrode and said second connecting electrode, said intermediate metal layer includes a plurality of stress relieving sublayers, and at least one migration resisting sublayer, said migration resisting sublayer being interposed between any two immediately adjacent ones of said stress relieving sublayers.

15. The light-emitting device of claim 14, wherein for each of said first connecting electrode and said second connecting electrode, a ratio of a thickness of said migration resisting sublayer to a thickness of each of said stress relieving sublayers is not greater than 1:3.

16. The light-emitting device of claim 14, wherein for each of said first connecting electrode and said second connecting electrode, said migration resisting sublayer is made of one of titanium and chromium.

17. The light-emitting device of claim 14, wherein for each of said first connecting electrode and said second connecting electrode, each of said stress relieving sublayers is made of Al, and said at least one migration resisting sublayer is made of Ti.

* * * * *